United States Patent [19]

Visioli, Jr. et al.

[11] 3,805,184

[45] Apr. 16, 1974

[54] GATED ASTABLE MULTIVIBRATOR

[75] Inventors: Armando Joseph Visioli, Jr., Dover; Harold Allen Wittlinger, Pennington, both of N.J.

[73] Assignee: RCA Corporation, New York, N.Y.

[22] Filed: July 9, 1973

[21] Appl. No.: 377,439

[52] U.S. Cl. ..................... 331/65, 307/116, 331/75, 331/108 D, 331/112, 331/113 R, 340/285

[51] Int. Cl. ........................ H03b 5/24, H03k 17/30

[58] Field of Search ............ 331/65, 66, 75, 108 D, 331/113 R, 112, 144; 307/116, 117, 125; 340/285; 317/146

[56] References Cited

UNITED STATES PATENTS 3,656,066 4/1972 Reynal ................................ 331/65

3,732,443 5/1973 Lovrenich ........................ 331/65 X

*Primary Examiner*—Herman Karl Saalbach

*Assistant Examiner*—Siegfried H. Grimm

[57] ABSTRACT

A gain controlled differential amplifier and a feedback circuit connecting the output terminal of the amplifier to its gain control terminal. When the input signals to the amplifier differ in one sense, the feedback signal produced is regenerative and oscillations result. When the input signals differ in the opposite sense, the feedback becomes degenerative and the output signal stabilizes at a fixed value.

13 Claims, 5 Drawing Figures

GATED ASTABLE MULTIVIBRATOR

This invention relates to multivibrators and particularly to gated astable multivibrators.

The uses for multivibrators are well known. In some applications it is desirable that a multivibrator be capable of selectively producing continuous oscillations (gated astable operation) in response to a control signal. Where the magnitude of the control signal is relatively small, (as in the case of some low output bridge sensors) it is customary to employ Schmitt triggers, differential amplifiers, comparators, or the like, to initially amplify the control signal to a level suitable for gating a conventional multivibrator (such as a unijunction transistor oscillator or cross-coupled flip flop circuit). The need for two separate circuits to produce gated astable operation for control signals in the millivolt region is both costly and complex.

The cost and complexity are multiplied in those applications which additionally require direct current isolation of ground reference levels between the multivibrator and a utilization device and further multiplied when the sensor is of a bridge (or other) configuration producing balanced differential output signals having relatively high values of common mode voltages.

A need exists for a multivibrator capable of gated astable operation in response to relatively small control signals. It would be particularly desirable if such a multivibrator was operable in response to differential input signals over a substantial common-mode input voltage range and was easily adaptable to applications requiring direct current isolation of its output signal.

In the embodiments of the present invention, a controllable gain differential amplifier receives first and second input signals. The amplifier is quiescently biased to a gain condition greater than unity. A feedback path, coupled between the output terminal and gain control terminal of the amplifier, provides feedback signals of a sense to cause oscillations when the input signals are of first relative values and of a sense to inhibit oscillations when the input signals are of second relative values.

The invention is illustrated in the accompanying drawings wherein like reference numbers designate like elements and in which:

FIG. 1–4 are circuit diagrams of embodiments of the invention; and

Figure 1:
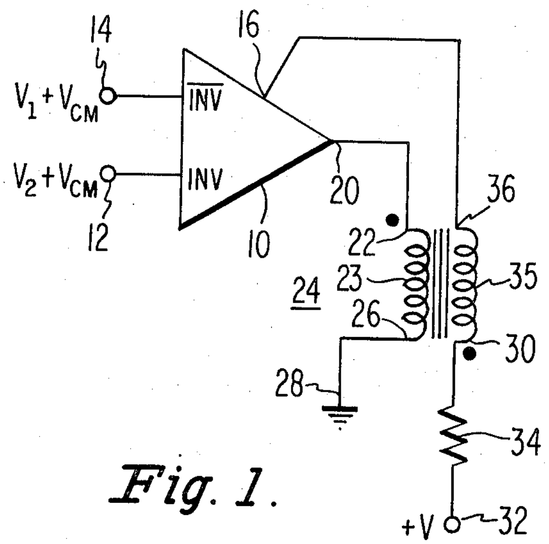
Figure 1A:
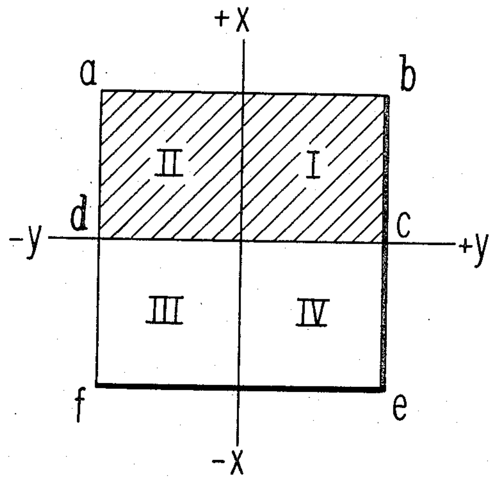

FIG. 1*a* is a diagram illustrating two quadrant multiplication.

Amplifier 10 of FIG. 1 is a differential amplifier which, in addition to having the customary inverting 12 and non-inverting 14 input terminals, also has a gain control terminal 16. The amplifier, thus, belongs to a general class of controllable gain amplifiers and, in this embodiment, to a particular class of amplifiers capable of two-quadrant multiplication of an input difference function and a gain control function.

A wide variety of circuit techniques are known and used in implementing gain control of amplifiers. It is helpful to an understanding of the present invention to review gain control techniques with particular attention to the specific requirements of the gain controlled differential amplifier 10 shown in the Figure.

Two principal forms of gain controlled amplifiers (multipliers) presently widely used are the so-called pulse-width pulse-height (PWPH) amplifier and the variable transconductance amplifier.

In PWPH gain controlled amplifiers, the input functions $x$ and $y$ are used to modulate the width and height of an internally generated pulse waveform. Integration of the pulse waveform produces an output signal proportional to the pulse area and hence the product of the input functions.

In variable transconductance amplifiers, the transconductance of a semiconductor device is made to vary in response to a control signal and suitable means are provided for effectively preventing the control signal itself from appearing in the amplifier output signal. This is explained in more detail subsequently.

Both types of amplifiers are capable of four quadrant as well as two quadrant operation. The distinction between four and two quandrant operation is illustrated in FIG. 1*a* where the ordinate represents values of a gain control function $x$ and the abscissa represents values of a controlled function $y$. The area bounded by letters $a$, $b$, $e$, and $f$ represents operating values of $x$ and $y$ in a four quadrant multiplier. The term "four quadrant" is used to describe permissible values of $x$ and $y$ since, as shown, both $x$ and $y$ may have positive or negative values, i.e., in a four quadrant multiplier, $x$ and $y$ may occupy each of the four quadrants, I, II, III, IV shown. In a two quadrant multiplier, one or the other of $y$ or $x$ is constrained to only positive or only negative values. For example, in FIG. 1*a* the area bounded by $a$, $b$, $c$, and d represents two quadrant operation where permissible values of $y$ are + and − while the only permissible value of $x$ is +.

Two quadrant operation of amplifier 10 is employed in the present invention. It will be apparent, however, that if one wishes to use a four quadrant amplifier (multiplier) according to the present invention he may do so by limiting the control signal in a suitable manner well known in the art. For example, diodes may be employed for limiting the control signal to only positive or negative values.

A second requirement of amplifier 10 is that it be capable of amplifying the difference between two input signals supplied to it. This may be accomplished by employing a separate differential amplifier having its output connected to one input terminal of a PWPH or variable transconductance multiplier. A better (more economical) approach however, is to employ a variable gain differential amplifier which performs both circuit functions. Operational transconductance amplifiers, such as the RCA CA3094, are presently commercially available which perform the functions of both differential amplification and gain control (multiplication) in two quadrants. The CA3094, for example, has a voltage gain proportional to a bias current supplied to its control terminal. Its gain is substantially zero for zero or negative bias (two quadrant operation).

Returning to FIG. 1, controllable gain differential amplifier 10 has an inverting input terminal 12 and an non-inverting input terminal 14. Output terminal 20 of amplifier 10 is coupled to dotted terminal 22 of primary winding 23 of transformer 24. The other terminal 26 of primary winding 23 is coupled to reference point 28, shown as ground in the figure. The dotted terminal 30 of the secondary winding 35 is coupled to reference terminal 32 by resistor 34. The other terminal 36 of secondary winding 35 is coupled to gain control terminal 16 of amplifier 10.

In operation, reference terminal 32 receives a positive reference potential +V. Input terminals 14 and 12 each receive input signals $V_1$ and $V_2$, respectively, and a common-mode voltage component $V_{cm}$. In some applications the common-mode voltage component may be at a reference level of zero volts. Its exact value is not critical to the operation of the present invention as long as it is within the common mode voltage range of amplifier 10. For example, for $V_{cm} = 0$ volts it may be desirable to operate amplifier 10 with symmetrical positive and negative supply voltages. Such biasing arrangements are very well known in the art and are not shown in FIG. 1 for simplicity.

Assume that amplifier 10 has the characteristics previously discussed i.e., it differentially amplifies signals applied to input terminals 12 and 14 in accordance with a gain control signal applied to terminal 16. Since the operation of amplifier 10 is restricted to two quadrants, assume in this example that the amplifier gain is proportional to positive values of the gain control signal and substantially zero for negative values of the gain control signal.

The relatively positive reference potential +V applied to terminal 32 causes current flow through resistor 34 and secondary winding 35 to gain control terminal 36. The purpose of reference potential +V is to initially bias amplifier 10 into a gain condition greater than unity. In a given application, other techniques may be employed to similarly bias amplifier 10. For example, resistor 34 may be directly connected between reference terminal 32 and gain control terminal 16. In such a case terminal 30 of transformer 34 should be suitably coupled to ground or another reference point. A suitably poled diode or a capacitor in series with secondary winding 36 may then, in a given case, be necessary to prevent shunt loss of the quiescent bias signal. Such minor circuit variations are so well known in the art that no further discussion of them is deemed necessary.

The dynamic operation of the circuit of FIG. 1 is as follows. When signal $V_1$ increases from a value more negative to a value more positive than signal $V_2$, output terminal 20 will provide a relatively positive output potential causing a current to flow into dotted terminal 22 of the transformer. Increasing primary current produces an increasing flux in transformer 24 which induces a voltage at secondary winding 35 of a sense to increase current flow into gain control terminal 16 which increases the gain of amplifier 10. This action continues until amplifier 10 saturates allowing no further increase in primary current. The rate-of-change of flux in transformer 24 thus decreases to zero so that secondary winding 35 no longer produces a signal of a sense to aid the quiescent bias current from reference terminal 32. The gain of amplifier 10 thus tends to decrease to its quiescent value but as the potential at output terminal 20 begins to decrease, the current flow into terminal 22 also decreases. This results in a decreasing flux in transformer 24 which induces voltage in secondary winding 35 of a sense to counteract (buck) the quiescent bias current from terminal 32. This further decreases the gain of amplifier 10. This effect continues until the potential at output terminal 20 can decrease no further. When this happens the rate of change of flux in transformer 24 again goes to zero, the opposing potential provided by secondary winding 35 goes to zero and the amplifier returns to quiescent gain condition. The effects described continue cyclically, producing continuous oscillations due to positive feedback so long as $V_1$ is greater than $V_2$.

There is a different situation, however, when $V_2$ is greater than $V_1$. In such a case, the nature of the feedback changes from positive (oscillatory) to negative (stable). Assume, for example, that $V_2$ changes to a value greater than $V_1$, output terminal 20 will change to a relatively lower potential causing a current to flow from dotted terminal 22 of transformer 24 to output terminal 20. This current flow produces a change in flux in the transformer which induces a voltage in secondary winding 35 in a sense to oppose the quiescent bias supplied to gain control terminal 16 and this reduces the amplifier gain. The effective feedback signal in this case is negative (tending to momentarily reduce the amplifier gain below unity so that the circuit eventually stabilizes to a steady state condition at its initial gain value. Note that if the amplifier were capable of four quadrant multiplication the circuit would be oscillatory because the output signal at terminal 20 would change signs as the gain control signal went negative. Since amplifier 10 is incapable of four quadrant multiplication, this situation does not occur. Of course, if a four-quadrant gain controlled differential amplifier were used here it would be necessary to limit its operation to two quadrants as previously suggested.

It will be appreciated that the relative phasing of the windings of transformer 24 is not critical to the operation of the present invention. For example, if the relative phasing is reversed the circuit operates in the manner described but oscillations are produced when $V_2$ is greater than $V_1$ and the oscillations cease when $V_1$ is greater than $V_2$.

The ability of the circuit of FIG. 1 to change the nature of its feedback in response to relative differences between the two input signals is a principal feature of the present invention which allows a single amplifier to perform the functions normally implemented by a differential amplifier and a gated oscillator. Moreover, by the inclusion of a third winding on transformer 24, the circuit of FIG. 1 can be easily and inexpensively isoltated from a utilization device as will be subsequently explained.

Figure 2:
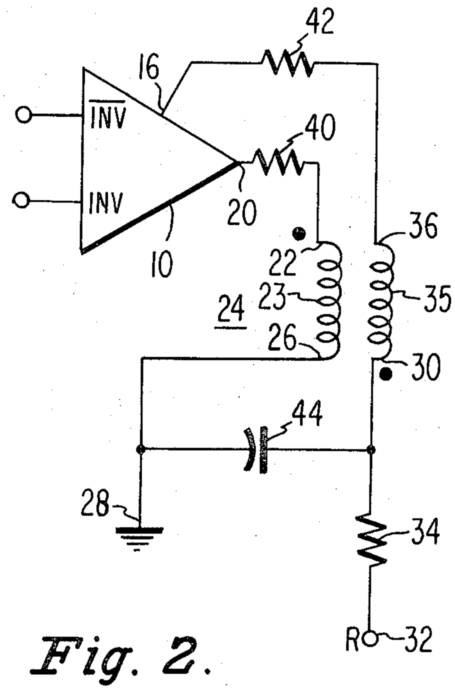

The circuit of FIG. 2 is similar in both structure and operation to that of FIG. 1 but additionally includes resistors 40 and 42 and capacitor 44. Resistor 40 is connected between output terminal 20 and dotted terminal 22. Its purpose is to limit current flow in primary winding 23 of transformer 24. A given transformer may have sufficient primary resistance without such a series resistor; if so, it may be omitted. Resistor 40 may also be omitted if the output impedance of amplifier 10 is sufficiently high to limit the primary current to acceptable values.

Capacitor 44 is coupled between ground 28 and dotted terminal 30 of transformer 24. The purpose of capacitor 44 is to provide a low impedance path to ground for feedback induced signals at terminal 30 while blocking the direct current bias provided by resistor 34. Such a capacitor may be needed where the secondary impedance of transformer 24 is vey much less than the value selected for resistor 34 in order for the feedback induced currents in secondary winding 35 to have an appreciable effect on the value of the gain control signal supplied to gain control terminal 16.

In applications where the relative values of the secondary impedance of transformer 24 and resistor 34 are such that bypass capacitor 44 is needed (i.e., a low turns ratio and high valued resistor), it may also be necessary to provide means for limiting the secondary current of the transformer to prevent excessive current flow to control terminal 16. This is accomplished in FIG. 2 by resistor 42 coupled between gain control terminal 16 and terminal 36 of the transformer. Of course, the resistor could be placed in series with capacitor 44 instead or, if the value of the secondary winding resistance is adequate, resistor 42 may be omitted entirely.

The embodiments of the invention shown in FIGS. 1 and 2 are particularly well suited to transformer isolation techniques since it is only necessary to add a third winding to transformer 24 with no need for a separate transformer to perform the isolation function. Economy results because, generally speaking, a single three-winding transformer is less expensive than a pair of two-winding transformers.

Figure 3:
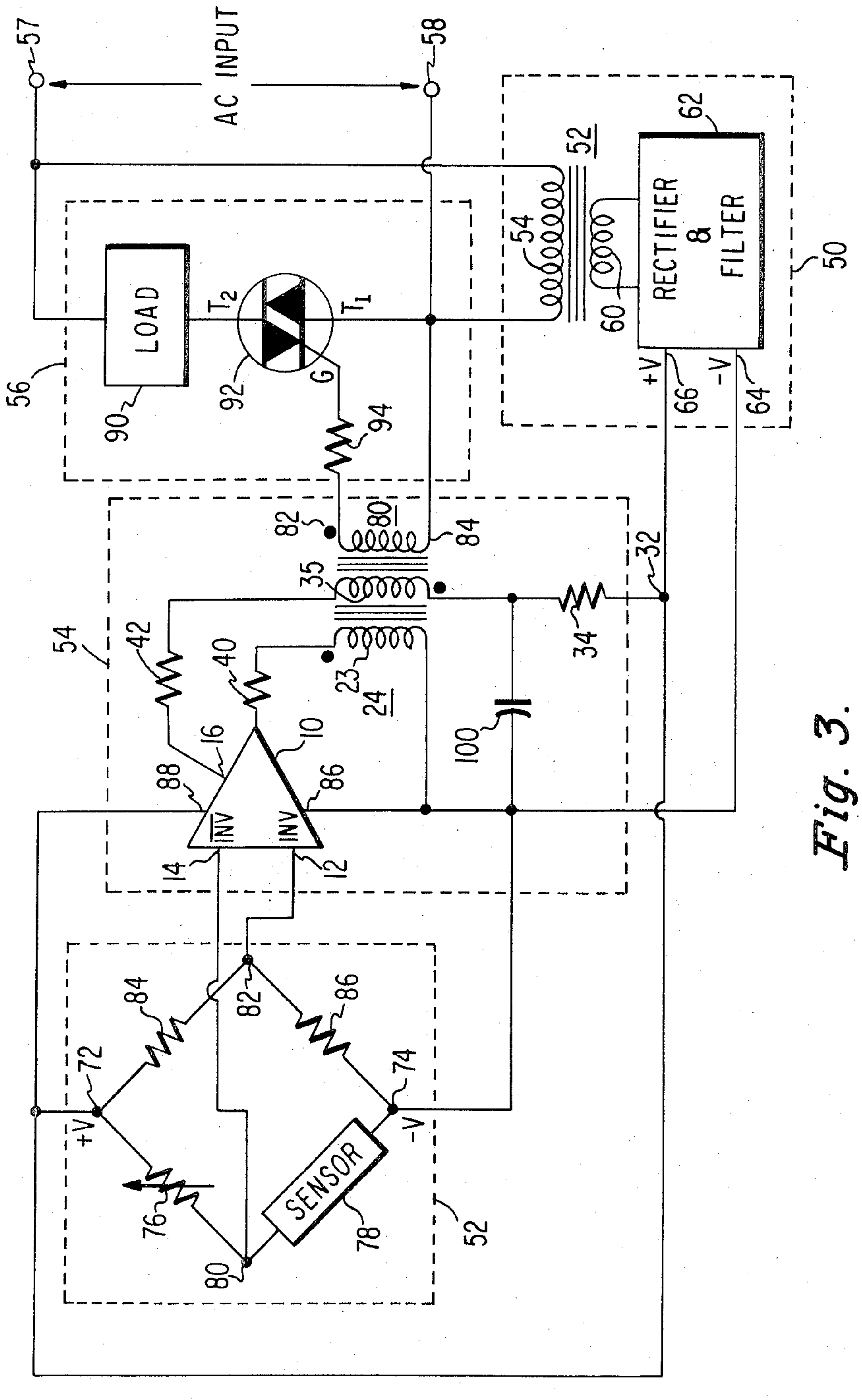

The embodiment of FIG. 3 illustrates the use of a third winding on transformer 24 to obtain direct current isolation in a control circuit employing the present invention. The principal elements of FIG. 3 comprise a transformer isolated direct current power supply 50, a condition responsive sensor 78 in a quarter-bridge configuration 52, a differentially gated astable multivibrator 54, and a thyristor controlled load 56.

In power supply 50, transformer 52 has its primary winding 54 coupled to AC input terminals 57 and 58. Secondary winding 60 of transformer 52 is coupled to the rectifier and filter indicated by box 62. The rectifier and filter provide direct current output potentials −V and +V at terminals 64 and 66 respectively. These voltages serve as operating potentials for bridge sensor 52 and multivibrator 54.

Bridge sensor circuit 52 receives operating potentials +V and −V at terminals 72 and 74, respectively. Bridge balance resistor 76 and condition responsive sensor 78 each separately couple bridge output terminal 80 to terminals 72 and 74 respectively. Bridge output terminal 82 is separately coupled by resistors 84 and 86 to terminals 72 and 74 respectively.

The bridge sensor circuit shown in a well known quarter-bridge configuration (one active arm, three passive arms). It is apparent that other suitable bridge configurations (such as half, three-quarter and full bridge) may be employed in the present invention. A quarter-bridge is shown for simplicity.

Multivibrator 54 is substantially that shown in FIG. 2 but additionally includes third winding 80 on transformer 24, having terminals 82 and 84. Terminal 82 is dotted to indicate the relative phasing of third winding 80 with respect to primary winding 23 and secondary winding 35. Power input terminals 86 and 88 of amplifier 10 are coupled to terminals 64 and 66, respectively, for receiving operating potentials −V and +V, respectively. Non-inverting input terminal 14 and inverting input terminal 16 are coupled to bridge output terminals 80 and 82 respectively. An operating potential +V is applied to terminal 32 of multivibrator 54 for causing a quiescent bias current to flow through resistor 34, secondary winding 35 and resistor 42 to gain control terminal 16.

Output circuit 56 includes load 90 coupled between AC input terminal 57 and main terminal $T_2$ of triac 92. Main terminal $T_1$ is coupled to AC input terminal 58. Gate terminal G is coupled by resistor 94 to terminal 80 of transformer 24. Terminal 84 of that transformer is coupled to main terminal $T_1$ of triac 92.

In temperature monitoring or control applications sensor 78 may be a temperature dependent element such as a resistor, thermistor, diode or the like. In a monitor, load 90 may be a lamp, bell, horn, recorder or other suitable device. In a controller, load 90 may be a fan, coolant pump, heater, or other appropriate device connected in feedback relationship to the sensor. For purposes of the following explanation of the operation of FIG. 3, assume that sensor 78 is a resistor having a negative temperature coefficient and that load 90 is a heater thermally coupled to sensor 78, the object being to maintain the thermal coupling medium at a desired reference temperature.

Assume initially that the temperature of the coupling medium is low. Upon application of AC power to terminals 57 and 58, power supply 50 produces operating potentials +V and −V which are direct current isolated from the power input terminals by the action of transformer 52. The operating potentials applied to bridge circuit 52 produce a common-mode potential $V_{cm}$ at terminals 80 and 82 under balanced bridge conditions. Assuming the bridge to have been initially balanced (by adjustment of resistor 76), the potential at terminal 80 will increase when the temperature is low since it was assumed that sensor 78 has a negative temperature coefficient. The potential at the non-inverting terminal, being greater than that of the inverting terminal of amplifier 10, causes multivibrator 54 to oscillate as previously described. The oscillations are transformer coupled through current limiting resistor 94 to the gate of thyristor 92, triggering it into a state of conduction.

When thyristor 92 conducts, load 90 receives AC input power and tends to increase the temperature of sensor 78 which decreases the potential at terminal 80 to a value below that of terminal 82, stopping multivibrator 54, which, in turn, turns off thyristor 92. The temperature is thus controlled in an ON-OFF fashion (a non-proportional system) with temperature variations determined, among other things, by the power input to load 90 and the thermal capacity (thermal time constant) of the system.

For most effective operation (maximum conduction angles of triac 92) it is desirable that the multivibrator frequency be high compared with the frequency of the AC input signal. (This would not be necessary, of course, if multivibrator 54 were suitably phase-locked to the AC input signal by, for example, introducing line frequency components into gain control terminal 16 in a manner well known in the differs In the examples given, however, multivibrator 90 serves as a free-running oscillator for a potential applied to terminal 14 which is greater than that applied to terminal 12.) In a given application, the minimum frequency for multivibrator 90 relative to that of the AC input signal will depend upon, among other things, the firing characteristics of triac 92 (gate sensitivity), the AC input frequency, the trigger potential produced by third winding 80 of transformer 24, and the minimum acceptable average conduction angle for triac 92. These parameters are merely a matter of design choice and will vary in accordance with a user's particular needs. They are mentioned to emphasize that the multivibrator output phase is independent of that of the AC input power and this should be considered in a particular controller design.

Figure 4:
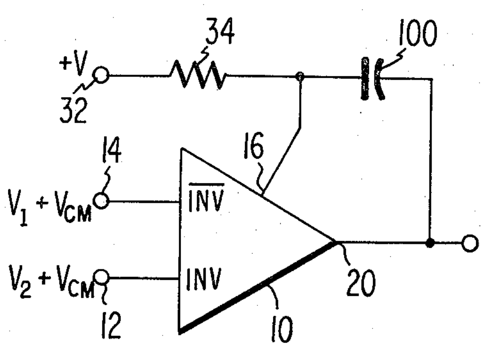

In FIG. 4 a feedback capacitor 100 is coupled between output terminal 20 and gain control terminal 16 of amplifier 10. Resistor 34 is coupled between reference terminal 32 and gain control terminal 16. Terminals 12 and 14 are inverting and non-inverting input terminals, respectively, of amplifier 10.

In general, operation of the circuit of FIG. 4 is similar to that previously described for FIG. 1 but differes in that the feedback signal is conducted by an electric field in a capacitor rather than by a magnetic flux in a transformer. FIG. 4 thus does not lend itself to the simplified transformer isolation techniques previously described but is useful in application where the size, weight and cost of transformer lessen the desirability of its use or where isolation is not required.

In the operation of the circuit of FIG. 4, application of a reference potential +V to reference potential terminal 32 causes current flow through resistor 34 to gain control terminal 16, biasing amplifier 10 to a gain condition greater than unity. Input signals $V_1 + V_{cm}$ and $V_2 + V_{cm}$ are applied to non-inverting input terminal 14 and inverting input terminal 12, respectively. When $V_1$ is changed from a value less than $V_2$ to a value greater than $V_2$, output terminal 20 will change to a relatively more positive value causing a current flow through capacitor 100 to gain control terminal 16. This current tends to increase the gain of amplifier 10, which further increases the output voltage at terminal 20. This action continues until capacitor 100 is fully charged, at which time the feedback current decreases, reducing the gain of amplifier 10 which in turn lowers the potential at output terminal 20. This decreasing potential is fed back to gain control terminal 16 by capacitor 100 further reducing the gain of amplifier 10 until the gain is reduced to substantially zero. Assuming no reverse current flow from gain control terminal 16, capacitor 10 is charged by current from resistor 34 increasing the potential at gain control terminal 16 which increases the gain of amplifier 10 and the cycle repeats. Continuous oscillations are thus produced as long as $V_1$ is greater than $V_2$.

As explained with regard to FIG. 1, a potenetial at terminal 12 greater than that of terminal 14 produces a decreasing output voltage at terminal 20. This change coupled to gain control terminal 16 by capacitor 100 reduces the amplifier gain and the amplifier stabilizes to a non-oscillatory condition.

The frequency and waveform of the oscillations produced by the embodiments shown and described is a function, among other things, of the gain control characteristics and effective output impedance of the particular controllable gain differential amplifier employed as well as the reactive characteristics of transformer 24 or feedback capacitor 100. The circuit of FIG. 3, for example, when employing the previously mentioned CA 3094 variable transconductance amplifier as amplifier 10 and a Sprague 11Z2104 pulse transformer as transformer 24 is capable of producing multivibrator output frequencies in excess of 10 kHz. Such a high frequency, compared to an AC power input frequency of 60 Hz, assures very high conduction angles for triac 92 when multivibrator 54 is oscillating.

It will be appreciated that other suitable amplifiers, having differential inputs and controllable gain (limited to two quadrants) may be employed in the present invention as well as other suitable transformers.

What is claimed is:

1. In combination:

controllable gain differential amplifier means having inverting and non-inverting input terminals for receiving separate input signals, a gain control terminal and an output terminal, said amplifier producing an output signal having a sense dependent on the sense of the difference between the two input signals, said amplifier having a gain proportional to the value of a gain control signal supplied to said gain control terminal when said gain control signal is of one sense, and said amplifier having a gain less than unity when said gain control signal is of opposite sense;

means coupled to said gain control terminal for biasing said amplifier to a quiescent gain condition greater than unity; and feedback means coupled between said output terminal and said gain control terminal for applying a regenerative feedback signal to said gain control terminal when said input signals differ in one sense, whereby oscillations result, and for applying a degenerative feedback signal to said gain control terminal when input signal differ in the opposite sense, whereby oscillations cease.

2. The combination recited in claim 1 wherein said feedback means comprises solely an alternating current feedback path between said output terminal and said gain control terminal for both providing said gain control signal to said amplifier and limiting the duration thereof.

3. The combination recited in claim 2 wherein said feedback means includes a transformer having primary and secondary windings, said primary winding coupled between said output terminal and a first point of reference potential, said secondary winding coupled between said gain control terminal and a second point of reference potential.

4. The combination recited in claim 3 further including means for limiting current flow through said primary winding.

5. The combination recited in claim 4 wherein said means biasing said amplifier comprises a resistor coupled between said second point of reference potential and one end of said secondary winding, the other end of said secondary winding coupled to said gain control terminal.

6. The combination recited in claim 5 further including a capacitor coupling the common connection of said resistor and secondary winding to said first point of reference potential.

7. The combination recited in claim 6 further including a third winding on said transformer for providing isolated output signals representative of the rate of change of flux within said transformer.

8. The combination recited in claim 7 further including semiconductor switch means coupled to said third winding for receiving said isolated output signals therefrom, and switching a load current in response thereto.

9. The combination recited in claim 8 further including condition responsive sensor means for supplying said input signals to said inverting and non-inverting input terminals and varying at least one of the signals in accordance with said conditions.

10. The combination recited in claim 2 wherein said feedback path includes a capacitor coupled between said output terminal and said gain control terminal.

11. The combination recited in claim 10 wherein said means biasing said amplifier comprises a resistor coupled between a point of reference potential and said gain control terminal.

12. The combination recited in claim 11 further including thyristor switch means coupled to said output terminal for receiving output signals therefrom and switching a load current in response thereto.

13. The combination recited in claim 12 further including condition responsive sensor means for supplying said input signals to said inverting and non-inverting input terminals and varying at least one of the signals in accordance with said conditions.

* * * * *